(12) United States Patent
Haddad

(10) Patent No.: US 9,099,966 B2
(45) Date of Patent: Aug. 4, 2015

(54) DUAL TIME ALIGNMENT ARCHITECTURE FOR TRANSMITTERS USING EER/ET AMPLIFIERS AND OTHERS

(75) Inventor: Khalil C. Haddad, Allen, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 216 days.

(21) Appl. No.: 13/091,551

(22) Filed: Apr. 21, 2011

(65) Prior Publication Data

US 2011/0260790 A1 Oct. 27, 2011

Related U.S. Application Data

(60) Provisional application No. 61/327,002, filed on Apr. 22, 2010.

(51) Int. Cl.
| | |
|---|---|
| *H01Q 11/12* | (2006.01) |
| *H03F 3/24* | (2006.01) |
| *H03F 1/30* | (2006.01) |
| *H03F 1/32* | (2006.01) |
| *H03F 3/195* | (2006.01) |

(52) U.S. Cl.
CPC .. *H03F 3/24* (2013.01); *H03F 1/30* (2013.01); *H03F 1/3247* (2013.01); *H03F 3/195* (2013.01); *H03F 2200/451* (2013.01)

(58) Field of Classification Search
USPC ............ 455/114.2, 114.3, 115.1, 115.4, 126, 455/127.1, 127.2, 127.3; 375/296, 297; 330/149, 151
See application file for complete search history.

(56) References Cited

U.S. PATENT DOCUMENTS

| | | | | |
|---|---|---|---|---|
| 5,808,512 | A * | 9/1998 | Bainvoll et al. | 330/151 |
| 6,836,517 | B2 * | 12/2004 | Nagatani et al. | 375/296 |
| 7,915,954 | B2 * | 3/2011 | Raghupathy et al. | 330/149 |
| 2006/0199553 | A1 * | 9/2006 | Kenington | 455/127.1 |
| 2009/0097591 | A1 * | 4/2009 | Kim | 375/297 |

* cited by examiner

*Primary Examiner* — Junpeng Chen

(57) ABSTRACT

An apparatus and method linearize a power amplifier in a transmitter by using a dual time alignment scheme. A first adjustable time delay unit delays a modulator signal input of a power amplifier. A first time delay estimator estimates a time delay between the delayed feedback signal and the reference signal, and adjusts the first adjustable time delay unit based on the estimated time delay between the delayed feedback signal and the reference signal. A second adjustable time delay unit delays the feedback signal. And a second time delay estimator estimates the time delay between the delayed feedback signal and the reference signal, and adjusts the second adjustable time delay unit based on the estimated time delay between the delayed feedback signal and the reference signal.

18 Claims, 3 Drawing Sheets

DUAL TIME ALIGNMENT ARCHITECTURE FOR TRANSMITTERS USING EER/ET AMPLIFIERS AND OTHERS

CROSS-REFERENCE TO RELATED APPLICATION(S) AND CLAIM OF PRIORITY

The present application is related to U.S. Provisional Patent Application No. 61/327,002, filed Apr. 22, 2010, entitled "DUAL TIME ALIGNMENT ARCHITECTURE FOR TRANSMITTERS USING EER/ET AMPLIFIERS AND OTHERS". Provisional Patent Application No. 61/327,002 is assigned to the assignee of the present application and is hereby incorporated by reference into the present application as if fully set forth herein. The present application hereby claims priority under 35 U.S.C. §119(e) to U.S. Provisional Patent Application No. 61/327,002.

TECHNICAL FIELD OF THE INVENTION

The present application relates generally an adaptive digital pre-distorter (DPD) for amplifier linearization in a radio frequency (RF) transmitter and, more specifically, to an apparatus and method for time alignment of reference and feedback signals to update parameters of the DPD.

BACKGROUND OF THE INVENTION

Time alignment in the prior art consists mainly of oversampling the signals of the forward and feedback path and then applying the cross correlation techniques in order to determine the delay with high accuracy between the two signals. Other techniques are based on some type of time delay estimator (TDE) in a closed loop fashion, however not all TDEs will work and produce a high accuracy useful time alignment.

The techniques may be found in the following patents and technical papers. These references are hereby incorporated into the present disclosure as if fully set forth herein:

REF1—U.S. Patent Application Publication No. 2003-0072388 A1 to Francos, et al., entitled "Time Delay Estimator In A Transmitter";

REF2—U.S. Patent Application Publication No. 2001-0005402 to Nagatani, et al., entitled "Distortion Compensating Apparatus";

REF3—U.S. Patent Application Publication No. 2008-0205571 to Muhammad, et al., entitled "System And Method For Time Aligning Signals In Transmitters";

REF4—Feipeng Wang et al., "Design Of Wide-Bandwidth Envelope Tracking Power Amplifiers For OFDM Applications", IEEE Transactions On Microwave Theory And Techniques, vol. 53, no. 4, April 2005;

Nagata, Y., "Linear Amplification Technique For Digital Mobile Communications", Vehicular Technology Conference, 1989 IEEE 39th; 1-3 May 1989, pp. 159-164, Volume 1; and Hao Li and al., "A Fast Digital Predistortion Algorithm For Radio-Frequency Power Amplifier Linearization With Loop Delay Compensation", IEEE Journal Of Selected Topics In Signal Processing, Volume 3, No. 3, June 2009.

The techniques based on oversampling the signals in the prior arts have limitations. In order to achieve high accuracy of time alignment, the acquired reference and feedback signals must be oversampled. The high sampling rate is required before the cross correlation operation to increase the accuracy of time alignment. Ten to twenty times oversampling is common and this requires a large amount of computation to perform the oversampling and the cross-correlation operations, and a large amount of information on the feedback signal is needed to achieve high accuracy in time alignment; therefore, a costly powerful DSP processor is needed. This becomes impractical from the point of view of implementation, cost, and speed of time aligning.

Also, it is very difficult to implement the scheme of oversampling the signal followed by a cross correlation operation in a Field-Programmable Gate Array (FPGA) due to the limitation of the FPGA clock speed; therefore, these techniques do not support real-time tracking of the time delay in order to make the proper delay adjustment.

A TDE block can be used to estimate the time shift between two signals. To perform the estimation, the TDE uses a correlation algorithm. However, the techniques of computing the correlation algorithm in the prior arts have limitations. That is, not all TDE blocks are useful in a DPD system. Some of the designs do not have the proper computational accuracy because they try to compute the correlation between two signals by representing the signals using one bit instead of representing the digital signals with multibit. Regarding the variable delay blocks, there are many ways to implement them. However, in the context of DPDs, it is important to use a variable delay block with a wide and flat bandwidth. In addition, TDEs that have been used previously do not support the dual time alignment needed for envelope elimination and restoration and envelope tracking (EER/ET) systems.

SUMMARY OF THE INVENTION

According to one aspect of the present disclosure, a method of linearizing a power amplifier in a transmitter is provided. A delay for a modulator signal input of a power amplifier is adjusted based on a reference signal and a delayed feedback signal. The delayed feedback signal is based on an output of the power amplifier, and the reference signal is based on a baseband signal.

According to another aspect of the present disclosure, an apparatus method for linearizing a power amplifier in a transmitter. The apparatus includes a first adjustable time delay unit and a first time delay estimator. The first adjustable time delay unit delays a modulator signal input of a power amplifier. The first time delay estimator estimates a time delay between the delayed feedback signal and the reference signal, and adjusts the first adjustable time delay unit based on the estimated time delay between the delayed feedback signal and the reference signal. The delayed feedback signal is based on an output of the power amplifier, and the reference signal is based on a baseband signal. The apparatus may also include a second adjustable time delay unit and a second time delay estimator. The second adjustable time delay unit delays the feedback signal. And the a second time delay estimator estimates the time delay between the delayed feedback signal and the reference signal, and adjusts the second adjustable time delay unit based on the estimated time delay between the delayed feedback signal and the reference signal.

According to yet another aspect of the present disclosure, an apparatus for linearizing a power amplifier in a transmitter is provided. The apparatus includes a first adjustable time delay unit and a first time delay estimator. The first adjustable time delay unit time aligns a forward signal input and a modulator signal input of a power amplifier. The first time delay estimator estimates a time delay between a delayed feedback signal and a reference signal, and adjusts the first adjustable time delay unit based on the time delay between the reference signal and the delayed feedback signal. The feedback signal is based on an output of the power amplifier, and the reference signal is based on a delayed baseband signal. The apparatus may also include a second adjustable time delay unit and a second time delay estimator. The second adjustable time delay unit time aligns the delayed feedback signal and the reference signal. The second time delay estimator estimates the time delay between the delayed feedback signal and the reference signal, and adjusts the second adjustable time delay unit based on the estimated time delay between the delayed feedback signal and the reference signal. In one embodiment, the second adjustable time delay unit delays the feedback signal. In another embodiment, the second adjustable time delay unit delays the baseband signal.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
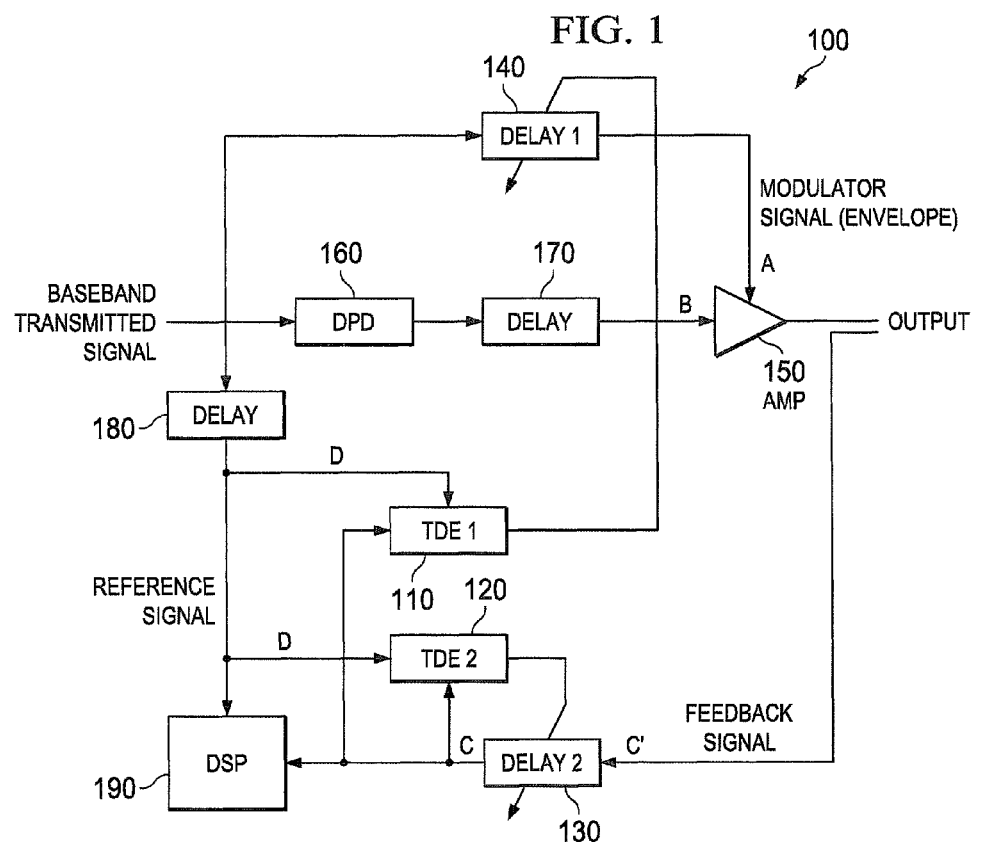
FIG. 1 illustrates a functional block diagram of a dual time alignment architecture according to an embodiment of the present disclosure.
Figure 2:
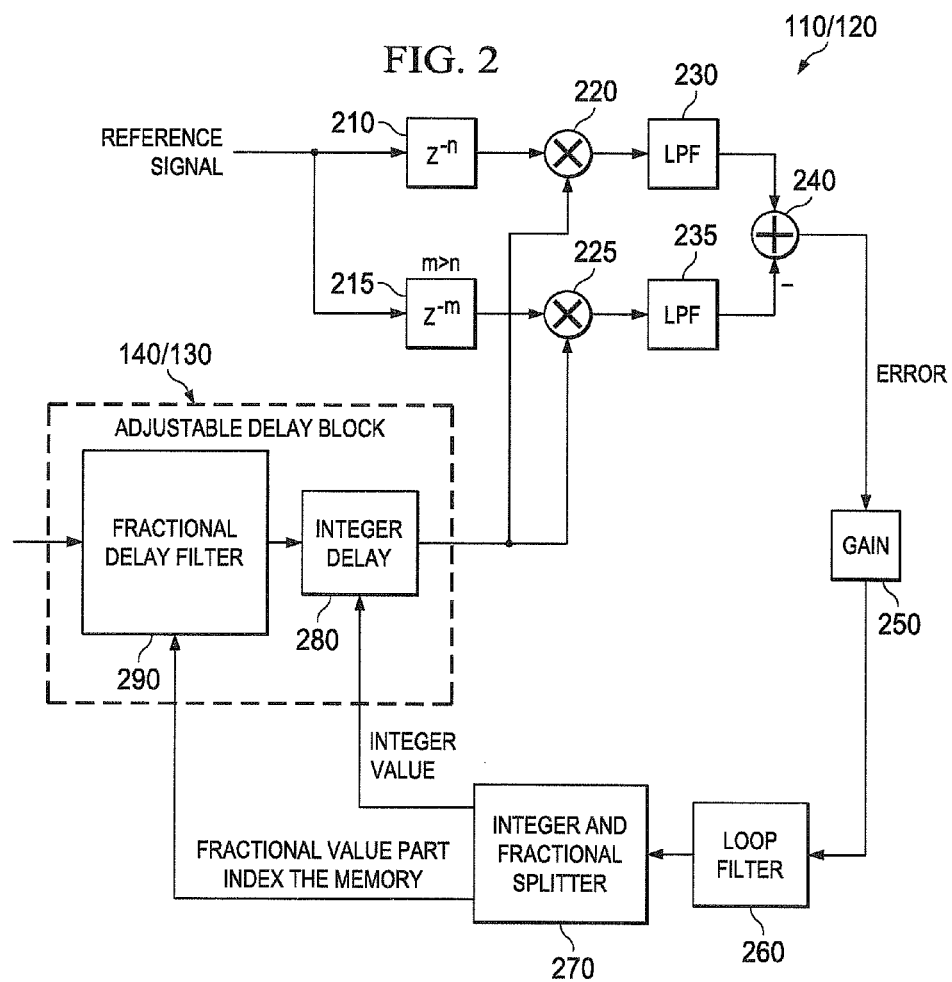
FIG. 2 illustrates a functional block diagram of a time delay estimator and an adjustable delay for performing a time alignment according to an embodiment of the present disclosure.
Figure 3:
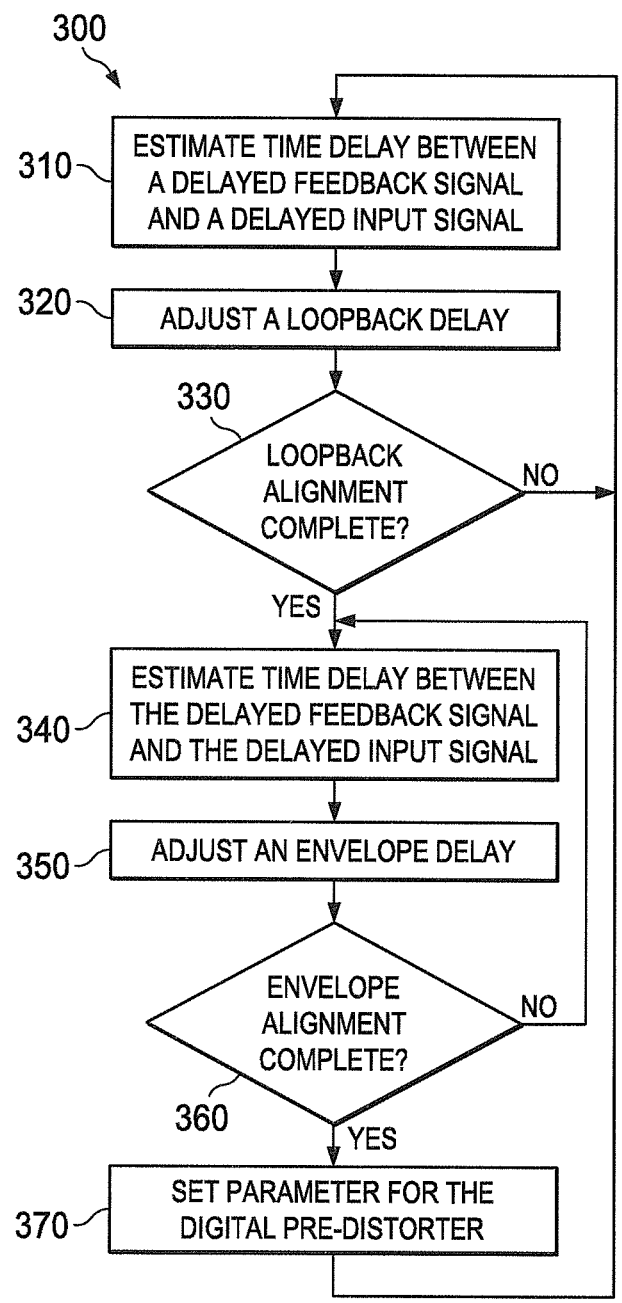
FIG. 3 illustrates a dual time alignment process according to an embodiment of the present disclosure.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged transmitter.

Radio frequency transmitters typically include a power amplifier (PA). The power amplifier may be operated in its non-linear region near saturation in order to increase the power efficiency. Due to the non-linearity of the PA, the adjacent channel leakage ratio (ACLR) level becomes unacceptable since the output spectrum will expand and cause interference with adjacent transmission channels. To fix this problem an amplifier linearization technique is performed by employing an adaptive digital pre-distorter (DPD) to preprocess the baseband signal and cancel out the nonlinearity of the PA.

FIG. 1 illustrates a functional block diagram of a dual time alignment architecture according to an embodiment of the present disclosure. For convenience, well-known functions or constructions that are not essential to the understanding of the present disclosure have been excluded for convenience as they would obscure the invention with unnecessary detail. The dual time alignment architecture 100 is used to indirectly perform envelope time alignment (i.e. time aligning the forward signal at point B and the modulator (envelope) signal at point A) by time aligning the reference signal (i.e. point D) and the delayed feedback signal (i.e. point C), and to perform a loop time alignment (i.e. time aligning the feedback and reference signals). According to an embodiment, the EER/ET amplifier architecture 100 includes a first time delay estimator (TDE) 110, a second TDE 120, a first adjustable delay block 140, a second adjustable delay block 130, a digital pre-distorter (DPD) 160, fixed delay blocks 170 and 180, and a digital signal processor (DSP) 190.

The DPD 160 is used to adaptively preprocess a baseband signal to cancel out the nonlinearity and output a forward signal to the power amplifier 150. In order to compute and constantly update the parameter of the DPD 160, two signals are needed: a reference signal and a digitized feedback signal from the output of the power amplifier (PA) 150. The reference signal is the digital transmitter (baseband) signal that has been delayed by the fixed delay block 180. The feedback signal at point C' is based on the output of the power amplifier 150 that has been is down-converted to baseband and digitized (not shown).

PA 150 may be an envelope tracking (ET) type, an envelope elimination and restoration (EER) type, or any type of architecture that can benefit from dual time alignment: envelope and loopback. The loopback delay is the delay between the reference signal (i.e. points D) and the delayed feedback signal (i.e. point C). The loopback time alignment is performed when the TDE block 120 properly adjusts the loopback delay. The envelope delay is the delay between the modulator signal (i.e. point A) and the forward signal (i.e. point B). Performing the envelope time alignment is needed to transmit the signal with high fidelity and undistorted as it is also need to compute the DPD parameters properly. Without high precision time envelope and loopback alignment, it is substantially difficult and costly to linearize an EER/ET type PA using a DPD in a robust manner.

The first TDE block 110 estimates the time delay between points A and B and adjusts the first adjustable delay block 140 to perform envelope time alignment in real time. The second TDE block 120 estimates the time delay between D and C and adjusts the second adjustable delay block 130 to perform the loopback time alignment in real time. According to an embodiment, for each iteration of dual time alignment, the first TDE block 110 performs the envelope time alignment after the second TDE block 120 has completed the loopback time alignment. The TDEs, which may have substantially identical architecture, will be described further with reference to FIG. 2. In an embodiment, the first TDE block 110 and second TDE block 120 may be implemented as a single TDE that can switch between envelope and loopback time alignment.

It is noted that envelope time alignment using the first TDE block 110 is distinguishable from prior art in that first TDE block 110 iteratively adjusts the delay (i.e. Delay 1) of the modulator (envelope) signal while using the reference and delayed feedback signals as its inputs.

The first adjustable delay block 140 delays an envelope (e.g. magnitude) signal that has been extracted from the transmitter (baseband) signal. The component that extracts the envelope signal is not shown but is well known by those of ordinary skill in the art. The second adjustable delay block 130 delays the feedback signal which is the result of down-converting and digitizing the output of the PA 150. The components for providing the feedback signal from the output of the PA 150 are not illustrated but are well known by those of ordinary skill in the art.

Each of the first adjustable delay block 140 and the second adjustable delay block 130 include an integer delay component and a fractional delay component. The integer and fractional delay components for each of the first and second adjustable delay blocks 140 and 130 are part of the closed feedback loop of the TDE blocks 110 and 120, respectively, and adjusted such that the output error (i.e. adder 240 of FIG. 2) is minimized (i.e. convergence is reached). Higher precision in the fractional delay component improves the accuracy of the dual time alignment. An example of a fractional delay component will be described further with reference to FIG. 2.

In an alternate embodiment, the first adjustable delay block 140 and the fixed delay block 170 on the forward path may be swapped. Similarly, the second adjustable delay block 130 and the fixed delay block 180 in the reference signal path may be swapped.

The DSP 190 sets the parameters for the DPD 160 after the dual time alignment. According to an embodiment, the DSP 190 may set the parameters for the DPD 160 after each iteration of performing the loopback time alignment and the envelope time alignment. In some embodiments, the DSP 190 may turn on the second TDE block 120 and the first TDE block 110 on a cold start. Thereafter, the dual alignment may run continuously while the PA 150 is on, and the DSP 190 automatically updates the parameters of the DPD 160.

According to an embodiment, the dual time alignment architecture 100 may be implemented in a Field-Programmable Gate Array (FPGA), an Application-Specific Integrated Circuit (ASIC), or in software that is executed by a microcontroller. In some embodiments, all functional blocks of the dual time alignment architecture 100 except for DSP 190 may be implemented in an FPGA, ASIC, or software. Unlike prior art, the functions of the dual time alignment architecture are not implemented as algorithms in the DSP 190.

Regarding the operation of the first TDE block 110 and the second TDE block 120 at cold start, it is assumed that the delay difference between the signals at points A and B (i.e. envelope delay) and the signals at points C and D (i.e. loopback delay) is in the range of the TDE acquisition capability (e.g. a delay difference of less than a number of samples). This can be achieved as the second TDE block 120 and the first TDE block 110 will run in an alternate matter (not simultaneously) until convergence is reached. According to an embodiment, the DSP 190 may control the alternations between the first TDE block 110 and the second TDE block 120. Alternatively, the FPGA on which the dual time alignment architecture 100 is implemented may control the operations of the first and second TDE blocks 110 and 120. According to yet another embodiment, the DSP 190 may control the initiation of the first and second TDE blocks 110 and 120 at cold start, and the FPGA may control the operations of the first and second TDE blocks 110 and 120 after the first dual alignment.

FIG. 2 illustrates a functional block diagram of a time delay estimator (TDE) and an adjustable delay for performing a time alignment according to an embodiment of the present disclosure. The TDE 110/120, which includes elements 210-270, is representative of the first TDE block 110 and/or the second TDE block 120 of FIG. 1 according to an embodiment of the present disclosure. The TDE 110/120 includes integer delays 210 and 215, multipliers 220 and 225, low pass filters 230 and 235, an adder 240, a gain filter 250, a loop filter 260, and an integer and fractional splitter 270.

The integer delay blocks 210 and 215 delay the reference signal by several integer multiples of sampling time units. Integer delay block 210 delays the reference signal by m time units, and the integer delay block 215 delays the reference signal by n time units, where n>m. The difference between n and m controls the acquisition range of the TDE. If the reference signal is represented as x(k), the integer delay block 210 outputs x(k−m) and the integer delay block 215 outputs x(k−n). The DSP 190 of FIG. 1 may adjust m and n according to an embodiment.

The multipliers 220 and 225 multiply the respective outputs of integer delay blocks 210 and 215 by the delayed feedback signal (i.e. at point C). That is, multiplier 220 multiplies the m delayed reference signal by the delayed feedback signal, and the multiplier 225 multiplies the n-delayed reference signal by the delayed feedback signal.

The outputs of the multipliers 220 and 225 are passed through low pass filters 230 and 235, respectively, and the adder (or subtractor) 240 calculates the difference. The output of adder 240 decreases and the reference signal (i.e. point D) and the delayed feedback signal (i.e. point C) converge. That is, when the reference signal and the delayed feedback signal are time aligned, the output of the adder 240 is zero.

Both the gain filter 250 and the loop filter 260 control the convergence speed and stability of the TDE. The integer and fractional splitter 270 receives the output of the loop filter 260 and outputs an integer value and a fractional value. The integer value and the fractional value are used to set the respective adjustable delay block. That is, the integer and fractional value outputs from the integer and fractional splitter 270 of the second TDE block 120 are used to set the delay of the second adjustable delay block 130, and the integer and fractional value outputs from the integer and fractional splitter 270 of the first TDE block 110 are used to set the delay of the first adjustable delay block 140.

The adjustable delay block 140/130, which is denoted by the dotted lines, includes an integer delay block 280 and a fractional delay filter block 290. The integer delay 280 delays the output signal of the fractional delay filter block 290 according to the integer value from the integer and fractional splitter 270.

The fractional delay filter block 290 includes a set of fractional delay filters (e.g. filter banks) that are stored in a memory and addressed dynamically by the corresponding TDE. For each address, a filter is loaded and used as a finite impulse response (FIR) filter to change the fractional delay accordingly. The address is based on the input of the fractional value. For example, the fractional value received from the integer and fractional splitter may be used to determine an index (i.e. the address) that corresponds to a particular filter. The size of the set of filters determines the fractional delay resolution. That is, a fractional delay filter block comprising '64' fractional delay filters has a fractional delay resolution of '1/64'. The fractional delay filters are designed to accommodate the bandwidth requirement of the DPD 160. According to an embodiment, the Lagrange method may be used to design such filters.

Using a bank of fractional delay filters performs better than fractional delays based on the Farrow structure, because the fractional delay filters have better phase linearity and better spectral flatness.

Furthermore, embodiments of the present disclosure allow higher speed of convergence. That is, hardware implementation of time alignment is achieved in real time for both envelope and loopback in a few microseconds, while performing the time alignment on software using a DSP may take up to a few seconds, which may not be acceptable according to some communication standards.

According to an embodiment, several designs of cross-correlators and adjustable delay blocks, with varying complexity and precision, may be used in the dual time alignment architecture 100. In an embodiment of the present disclosure, a combination of a cross-correlator with high numerical computational precision that maximizes the precision of delay estimation and a high resolution adjustable delay block that covers the wide bandwidth is used.

According to an embodiment, all of the components of the dual time alignment architecture 100 (with the DSP 190 being optional) may be implemented on an FPGA with insignificant very low amount of hardware (logic) resources. In an embodiment, one or two multipliers are needed for each TDE.

FIG. 3 illustrates a dual time alignment process according to an embodiment of the present disclosure. Process 300 will be described with reference to the dual time alignment architecture 100 of FIG. 1. However, this does not limit the scope of the present disclosure, as any other architecture that includes components capable of performing similar functions may perform process 300.

In block 310, the time delay between a delayed feedback signal (i.e. point C) and a delayed input signal (i.e. reference signal at point D) is estimated by the second TDE block 120. According to an embodiment, when the dual time alignment process is in a cold start, DSP 190 may control the dual time alignment architecture 100 to switch on the second TDE block 120. In block 320, the delay value of the second adjustable delay block 130 is adjusted based on the estimated delay by the second TDE block 120.

In block 330, the dual time alignment architecture 100 determines whether the loopback alignment is complete. In an embodiment, whether the loopback alignment is complete may be determined based on the error value output by the adder 240 in the second TDE block 120. Alternatively, the process 300 may require the second TDE block 120 to perform loopback alignment for a specific number of input data from the reference and feedback signals. In this situation, a counter may be used to determine whether the loopback alignment has been performed a threshold number of times. If the loopback alignment is not complete, the process returns to block 310.

In contrast, if the loopback alignment is completed, the time delay between the delayed feedback signal (i.e. point C) and a delayed input signal (i.e. reference signal at point D) is estimated by the first TDE block first TDE block 110 in block 340. According to an embodiment, when the dual time alignment process is in a cold start, DSP 190 may control the dual time alignment architecture 100 to switch from the second TDE block 120 to the first TDE block 110. In block 350, the delay value of the first adjustable delay block 140 is adjusted based on the estimated delay by the first TDE block 110.

In block 360, the dual time alignment architecture 100 determines whether envelope alignment is complete. In an embodiment, whether the envelope alignment is complete may be determined based on the error value output by the adder 240 in the first TDE block 110. Alternatively, the process 300 may require the second TDE block 110 to perform envelope alignment for a specific number of input data from the reference and feedback signals. In this situation, a counter may be used to determine whether the loopback alignment has been performed for a threshold number of times. If the loopback alignment is not complete, the process returns to block 340.

In block 370, parameters for the DPD 160 are adjusted by the DSP 190 to linearize the PA 150. Once the dual alignment has been completed for the first time, the loopback alignment and envelope alignment may be performed and the parameters for the DPD 160 adjusted continuously until the PA 150 is turned off in block 390.

The embodiments described in the present disclosure allow a wide acquisition range with fast convergence and robust tracking. Furthermore, embodiments of the present disclosure may perform real time tracking without intervention from the DSO and without interruption. The delays may be tracked and adjusted according to changes in temperature as long as the reference and feedback signals are available.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method of linearizing a power amplifier in a transmitter, the method comprising:
   adjusting a loopback delay for a feedback signal based on an estimated delay time between a reference signal and the delayed feedback signal taken from an output of the power amplifier; and
   adjusting an envelope delay for a modulator signal input of the power amplifier based on an estimated time delay between the reference signal and the adjusted feedback signal,
   wherein the reference signal is based on a baseband signal, and
   wherein a loopback delay estimator and an envelope delay estimator are coupled to the loopback delay and the envelope delay, and repeatedly switching between envelope and loopback adjustment until convergence is reached.

2. The method of claim 1, further comprising:
   estimating the estimated time delay between the delayed feedback signal and the reference signal,
   wherein the delay for the modulator signal input of the power amplifier is adjusted based on the estimated time delay between the delayed feedback signal and the reference signal.

3. The method of claim 2, wherein estimating the estimated time delay between the delayed feedback signal and the reference signal comprises determining an integer component of the estimated time delay and a fractional component of the estimated time delay.

4. The method of claim 3, further comprising:
   determining an index of a corresponding fractional delay filter based on the fractional component of the estimated time delay; and
   loading the corresponding fractional delay filter.

5. The method of claim 1, wherein the delay for the modulator signal input of the power amplifier and a delay for the delayed feedback signal are adjusted continuously.

6. The method of claim 1, wherein the delay for the delayed feedback signal is adjusted prior to adjusting the delay for the modulator signal input of the power amplifier on startup.

7. An apparatus for linearizing a power amplifier in a transmitter, the apparatus comprising:
- a first adjustable time delay unit configured to delay a modulator signal input of the power amplifier;
- a first time delay estimator configured to adjust the first adjustable time delay unit based on a reference signal and a adjusted feedback signal, wherein the adjusted feedback signal is based on an output of a second adjustable time delay unit and the reference signal is based on a baseband signal;
- the second adjustable time delay unit configured to delay the feedback signal; and
- a second time delay estimator configured to estimate a feedback time delay between the delayed feedback signal taken from an output of the power amplifier and the reference signal, and to adjust the second adjustable time delay unit based on the estimated feedback time delay between the delayed feedback signal and the reference signal,
- wherein the first time delay estimator and the second time delay estimator are coupled to the first and second adjustable time delay units, and repeatedly switches between envelope and loopback adjustment until convergence is reached.

8. The apparatus of claim 7, wherein the first time delay estimator is further configured to estimate a time delay between the delayed feedback signal and the reference signal, and to adjust the first adjustable time delay unit based on the estimated time delay between the delayed feedback signal and the reference signal.

9. The apparatus of claim 8, wherein the first time delay estimator is further configured to determine an integer component of the estimated time delay and a fractional component of the estimated time delay.

10. The apparatus of claim 9, wherein the first adjustable time delay unit comprises:
- an integer delay unit configured to delay the modulator signal by a integer multiple of a sampling time based on the integer component of the estimated time delay; and
- a fractional delay filter unit configured to determine an index of a corresponding fractional delay filter based on the fractional component of the time delay, to load the corresponding fractional delay filter from a memory, and to delay the modulator signal by a fraction of the sampling time based on the fractional delay filter.

11. The apparatus claim 7, wherein the first time delay estimator and the second time delay estimator are further configured to operate continuously while the power amplifier is in operation.

12. The apparatus of claim 7, wherein the first time delay estimator is further configured to adjust the first adjustable time delay unit after the second time delay estimator has adjusted the second adjustable time delay unit.

13. An apparatus for linearizing a power amplifier in a transmitter, the apparatus comprising:
- a first adjustable time delay unit configured to time align a forward signal input and a modulator signal input of the power amplifier;
- a first time delay estimator configured to estimate a time delay between a delayed feedback signal and a reference signal, and to adjust the first adjustable time delay unit based on the time delay between the reference signal and the adjusted feedback signal, wherein the adjusted feedback signal is based on an output of a second adjustable time delay unit and the reference signal is based on a delayed baseband signal;
- the second adjustable time delay unit configured to time align the delayed feedback signal and the reference signal; and
- a second time delay estimator configured to estimate a feedback time delay between the delayed feedback signal and the reference signal, and to adjust the second adjustable time delay unit based on the estimated feedback time delay between the delayed feedback signal and the reference signal,
- wherein the first time delay estimator and the second time delay estimator are coupled to the first and second adjustable time delay units, and repeatedly switches between envelope and loopback adjustment until convergence is reached.

14. The apparatus of claim 13, wherein the first adjustable time delay unit is further configured to delay the forward signal input.

15. The apparatus of claim 14, wherein the first time delay estimator is further configured to determine an integer component of the estimated time delay and a fractional component of the estimated time delay.

16. The apparatus of claim 13, wherein the first time delay estimator is further configured to adjust the first adjustable time delay unit after the second time delay estimator has adjusted the second adjustable time delay unit.

17. The apparatus of claim 13, wherein the second adjustable time delay unit is further configured to delay a baseband signal.

18. The apparatus of claim 15, wherein the first adjustable time delay unit comprises:
- an integer delay unit configured to delay the modulator signal by a integer multiple of a sampling time based on the integer component of the estimated time delay; and
- a fractional delay filter unit configured to determine an index of a corresponding fractional delay filter the based on the fractional component of the time delay, to load the corresponding fractional delay filter from a memory, and to delay the modulator signal by a fraction of the sampling time based on the fractional delay filter.

* * * * *